United States Patent
Ho et al.

(10) Patent No.: US 9,109,283 B2
(45) Date of Patent: Aug. 18, 2015

(54) STRUCTURE OF REACTION CHAMBER OF SEMICONDUCTOR SPUTTERING EQUIPMENT

(71) Applicant: SHIH HER TECHNOLOGIES INC., Hsin Chu Hsien (TW)

(72) Inventors: Wen-Chin Ho, Hsin Chu Hsien (TW); Tsung-Chih Chou, Hsin Chu Hsien (TW); Shyue-Jer Chern, Hsin Chu Hsien (TW)

(73) Assignee: SHIH HER TECHNOLOGIES INC., Hsin Chu Hsien (TW)

( * ) Notice: Subject to any disclaimer, the term of this patent is extended or adjusted under 35 U.S.C. 154(b) by 289 days.

(21) Appl. No.: 13/776,812

(22) Filed: Feb. 26, 2013

(65) Prior Publication Data

US 2014/0238851 A1    Aug. 28, 2014

(51) Int. Cl.
| | |
|---|---|
| *C23C 14/34* | (2006.01) |
| *H01L 21/687* | (2006.01) |
| *C23C 14/56* | (2006.01) |
| *H01J 37/32* | (2006.01) |
| *H01J 37/34* | (2006.01) |

(52) U.S. Cl.
CPC ............... *C23C 14/34* (2013.01); *C23C 14/564* (2013.01); *H01J 37/32477* (2013.01); *H01J 37/34* (2013.01); *H01L 21/68757* (2013.01)

(58) Field of Classification Search
CPC . C23C 14/34; C23C 14/564; H01J 37/32477; H01J 37/34; H01J 21/68757; H01J 37/32642; H01J 37/32651; H01J 37/3435; H01J 37/3441; H01J 37/3447
USPC .......................... 204/298.12, 298.13, 298.11
See application file for complete search history.

(56) References Cited

U.S. PATENT DOCUMENTS 8,221,602 B2 * 7/2012 Brown et al. ............ 204/298.11

* cited by examiner

*Primary Examiner* — Rodney McDonald
(74) *Attorney, Agent, or Firm* — Lin & Associates IP, Inc.

(57) ABSTRACT

A structure of reaction chamber of semiconductor sputtering equipment is disclosed, including a chamber case, an elevation platform, a plurality of target fixing elements, a carrier ring and a covering protective ring, wherein the contact surface of the target fixing element, the ring-shaped protruding surface of the carrier ring and the attachment surface of the covering protective ring are all coarse surfaces with uneven patterns. As such, during sputtering, the contact surface, ring-shaped protruding surface and attachment surface can withstand the deposition thickening and extend the cycle of cleaning components and life span so as to improve utilization rate of the equipment and reduce the manufacturing cost.

10 Claims, 8 Drawing Sheets

STRUCTURE OF REACTION CHAMBER OF SEMICONDUCTOR SPUTTERING EQUIPMENT

FIELD OF THE INVENTION

The present invention generally relates to a technical field of structure of reaction chamber of semiconductor sputtering equipment, and more specifically to a design with coarse surface on specific elements inside the reaction chamber.

BACKGROUND OF THE INVENTION

Sputtering, or physical vapor deposition (PVD), is a deposition method to add layers of metal and related material during manufacturing semiconductor. The sputtering equipment includes vacuum reaction chamber and a target disposed inside the reaction chamber. The sputtering equipment includes a power supply to supply voltage to the target so that the target material is deposit onto the wafer loaded on a tray.

A plurality of fixing elements is in the reaction chamber to fix the target, wafer or other components. A protection plate is also included to prevent specific area from being covered by deposition. During sputtering, the deposition will also be deposited onto the surface of each fixing element and the protection plate in addition to the wafer. As the number of sputtering increases, the deposition accumulated on the fixing element and the protection plane is thickened. Once the deposition is peeled off, the yield rate is affected. Therefore, the sputtering equipment must be offline periodically for cleaning; in other words, disassembling the fixing elements or the protection plane for replacement or cleaning the deposition, which results in the reduction of the utilization rate of the equipment and increase in cost. In the conventional equipment, the surface of some components forms a layer of aluminum sprayed coating. In predefined operation cycle, the performance of yield rate is good. However, when the time between cleanings or the replacements is extended, the yield rate will drop greatly. Thus, it is desirable to devise a structure of reaction chamber of semiconductor sputtering equipment to address the above problems.

SUMMARY OF THE INVENTION

The primary object of the present invention is to provide a structure of reaction chamber of semiconductor sputtering equipment that is able to extend the replacement cycle. The main feature is to coarsen surfaces of some components to extend the number of depositions the component is able to withstand on the condition of no deposition peeling so that the utilization rate of the equipment is improved and the cost is reduced.

To achieve the above object, the reaction chamber of the semiconductor sputtering equipment of the present invention includes: a chamber case, an elevation platform, a plurality of target fixing elements, a carrier ring and a covering protective ring, wherein the chamber case includes a hollow chamber and is disposed with a support base of ring shape at the bottom. The elevation platform can access the space formed by the center of the support base. The plurality of target fixing elements is fixed to the inner wall of the chamber case, and the target fixing element has an exposed contact surface. The carrier ring is disposed on the elevation platform and has a ring-shaped protruding surface. The covering protective ring is disposed on the support base, and includes an attachment surface. The contact surface of the target fixing element, the ring-shaped protruding surface of the carrier ring and the attachment surface of the covering protective ring are all coarse surfaces. The coarse surface has uneven patterns, wherein one of the patterns is a non-smooth surface formed by a plurality of crisscrossed trenches.

The main feature of the present invention is that the contact surface of the target fixing element, the ring-shaped protruding surface of the carrier ring and the attachment surface of the covering protective ring are all coarse surfaces. The coarse surface improves the surface area and coarseness of the surface. The increase of surface area improves the number of the depositions that the element can withstand and extends the use cycle of the component. Therefore, the replacement rate is reduced, the utilization rate is increased and the cost is reduced. The coarseness of the surface can prevent the deposition from abnormal peeling off during manufacturing process. As such, the yield rate and the quality are improved.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

Figure 1:
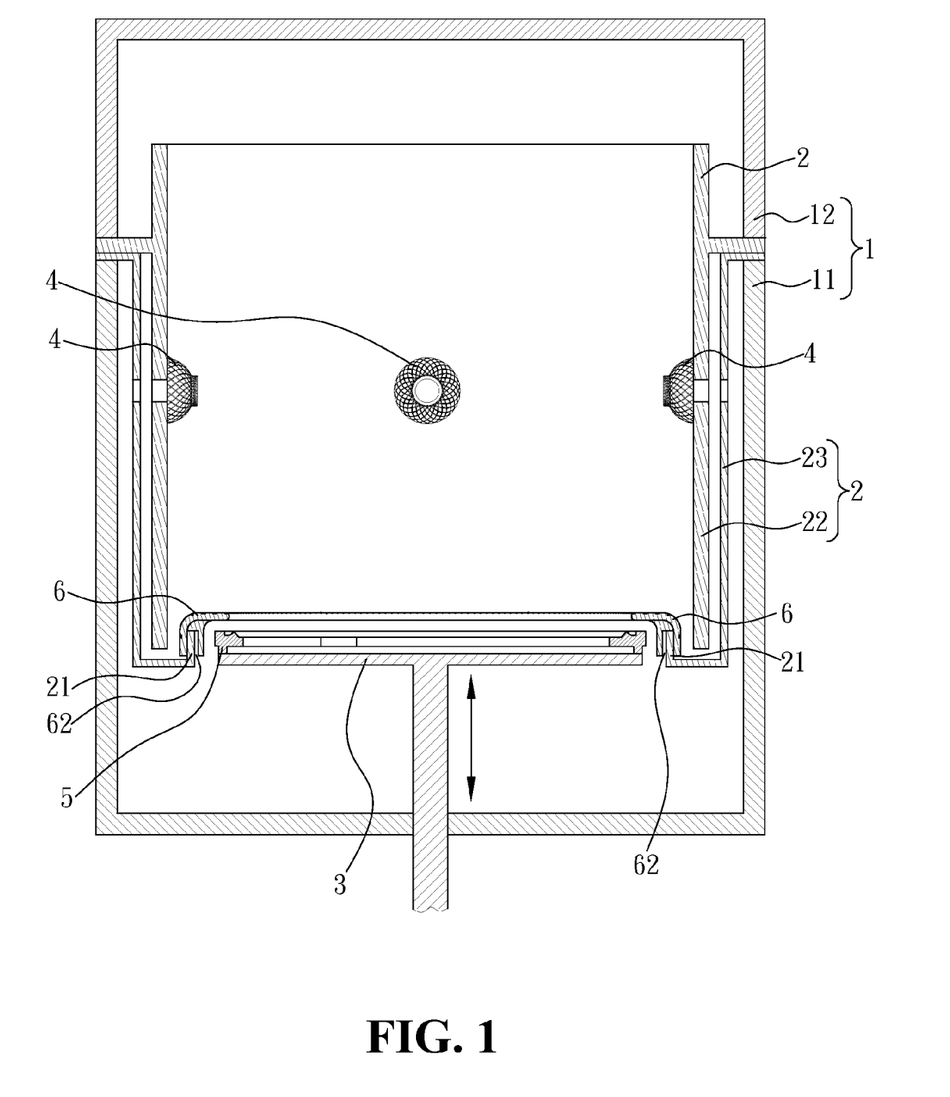
FIG. 1 shows a cross-sectional view of the structure according to the present invention.
Figure 2:
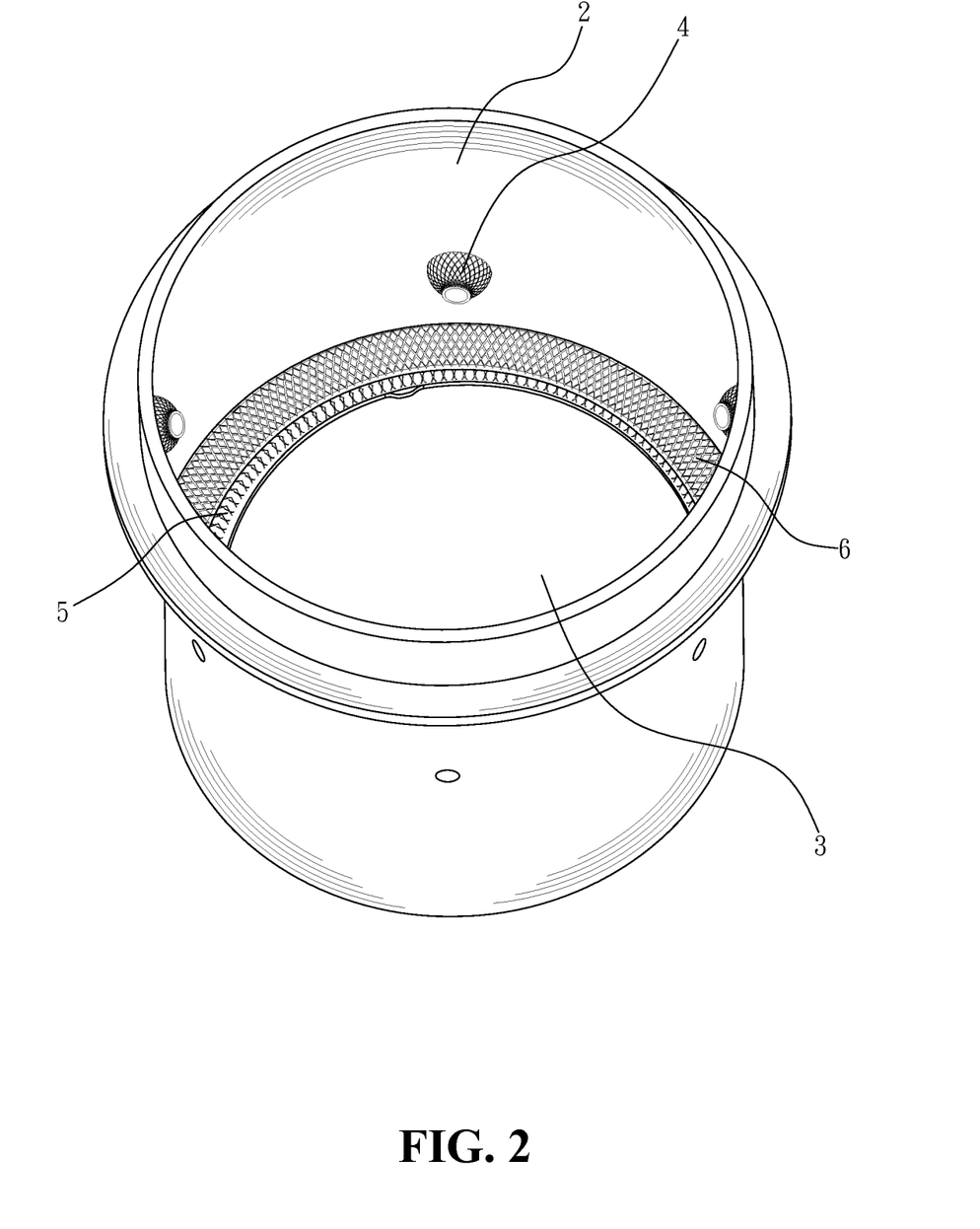
FIG. 2 shows a schematic view of the chamber case, target fixing element, carrier ring and covering protective ring of the present invention.

FIG. 1 shows a cross-sectional view of the structure of the reaction chamber of semiconductor sputtering equipment according to the invention. The reaction chamber 1 is formed by a reaction chamber base 11 and a reaction chamber lid 12 so that the internal space satisfies the vacuum condition required during sputtering. Inside the reaction chamber, there is a chamber case 2, an elevation platform 3, a plurality of target fixing elements 4, a carrier ring 5 and a covering protective ring 6. The chamber case 2 is a hollow chamber, serving as the main reaction space during sputtering. The plurality of target fixing elements 4 is fixed on an inner wall of the chamber case 2, for fixing a target inside the chamber case 2 with other locking elements. The chamber case 2 is disposed with a ring-shaped support base 21, and the covering protective ring 6 is disposed at the support base 21 for shielding the part from sputtering deposition. The carrier ring 5 is disposed on the elevation platform 3, for carrying the wafer to be processed. The elevation platform 3 can move upwards and downwards to carry the wafer into the space formed by the center of the support base 21 or retrieve the wafer out of the space formed by the center of the support base 21 so that the wafer can go through the sputtering process inside the chamber case 2. In addition, the chamber case 2 is a double-layer hollow chamber formed by a protective wall 22 and an outer wall 23. The support base 21 is at the bottom of the outer wall 23. The support base 21 extends to below the space formed by the protective wall 22 in the inner layer.

During sputtering, the target material is mainly deposited onto the surface of the wafer, and inevitably onto surface of each component inside the chamber case 2, such as, target fixing element 4, carrier ring 5 and covering protective ring 6. To improve the utilization rate of the equipment and extend the cycle for cleaning the components, as shown in FIGS. 2-5, the present invention adopts coarse surfaces for contact surface 41 of the target fixing element 4, ring-shaped protruding surface 51 of the carrier ring 5 and attachment surface 61 of the covering protective ring 6. The coarse surface has an uneven pattern. In the present embodiment, the pattern is an a non-smooth surface formed by a plurality of crisscrossed trenches. To further increase the life span, a layer of aluminum sprayed coating can be formed on the contact surface 41, ring-shaped protruding surface 51 and attachment surface 61.

Figure 3:
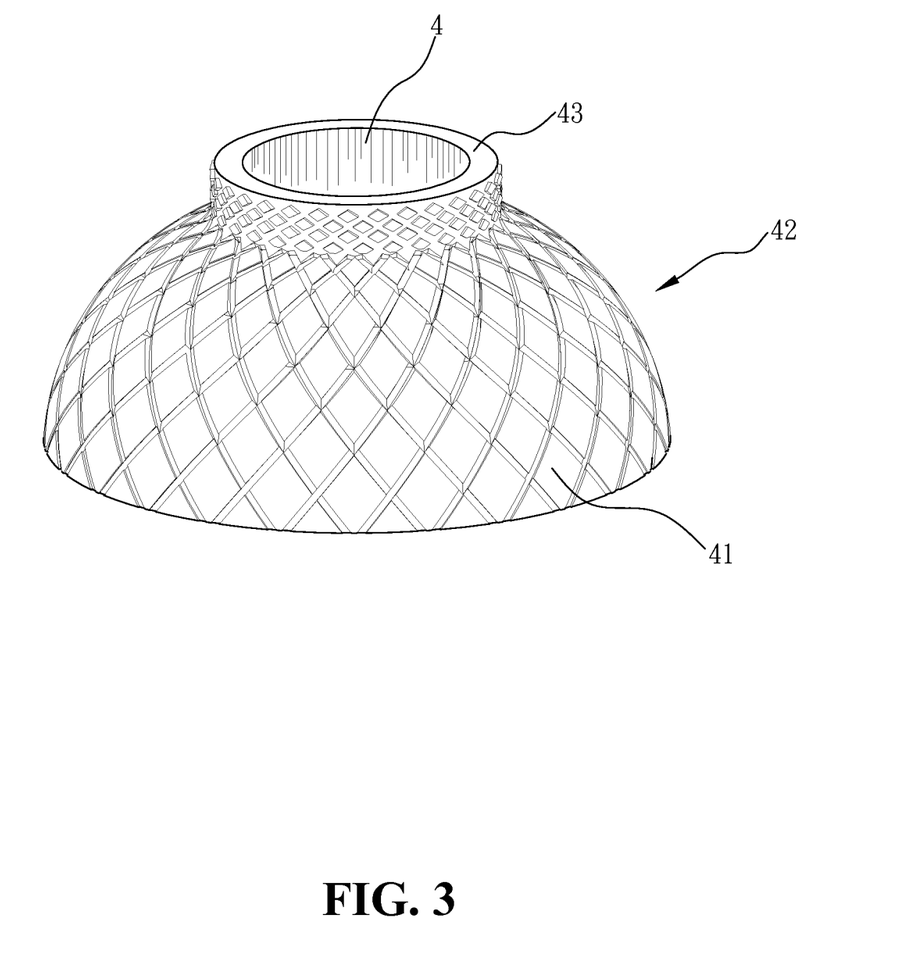
FIG. 3 shows a schematic view of the target fixing element of the present invention.

As shown in FIG. 3, the target fixing element 4 has a hollow shape, formed by an arc cone 42 and a cylinder 43. The cylinder 4 is located at the smaller end of the arc cone 42. The contact surface 41 is the outer surface of the arc cone 42 and cylinder 43. For easy processing, the contact surface 41 of the present embodiment is a coarse surface, but the present invention imposes no specific restriction here. Because the peeling of the deposition mainly occurs at the surface with non-zero outer curvature of the target fixing element 4, the coarse surface on the contact surface 41 can also be limited to a partial surface, in other words, the outer surface of the arc cone 42, or the joint part of the arc cone 42 and cylinder 43.

Figure 4A:
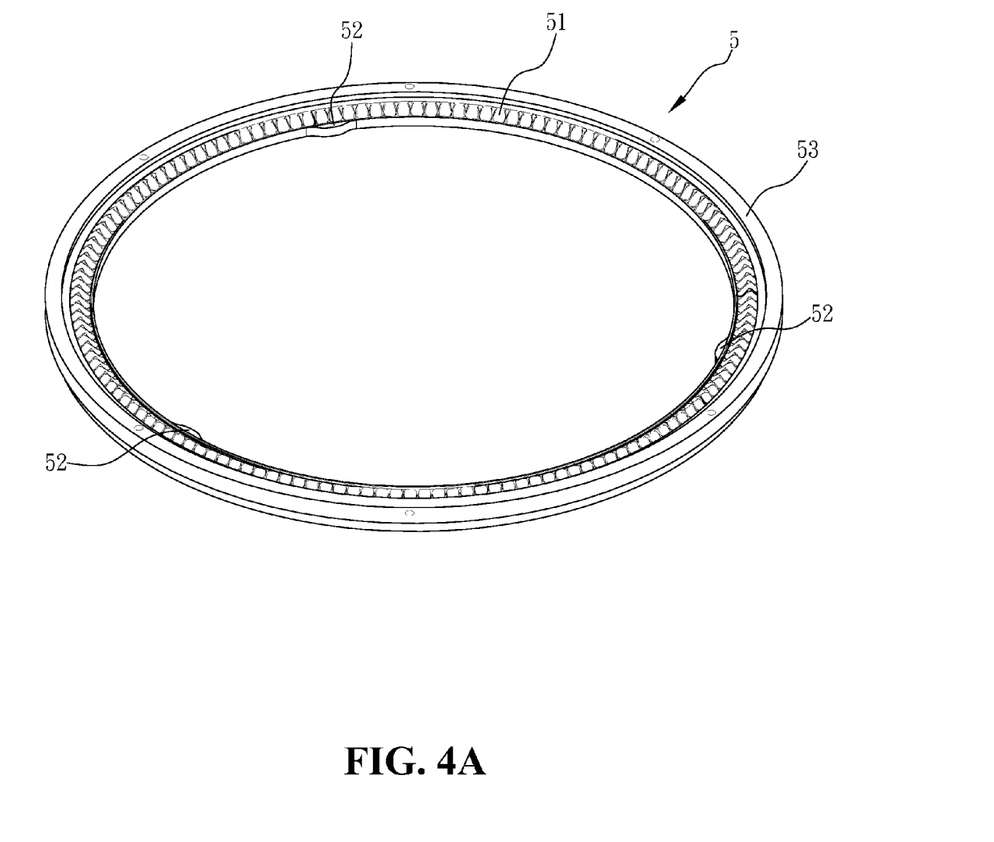
FIG. 4A shows a schematic view of the carrier ring of the present invention.
Figure 4B:
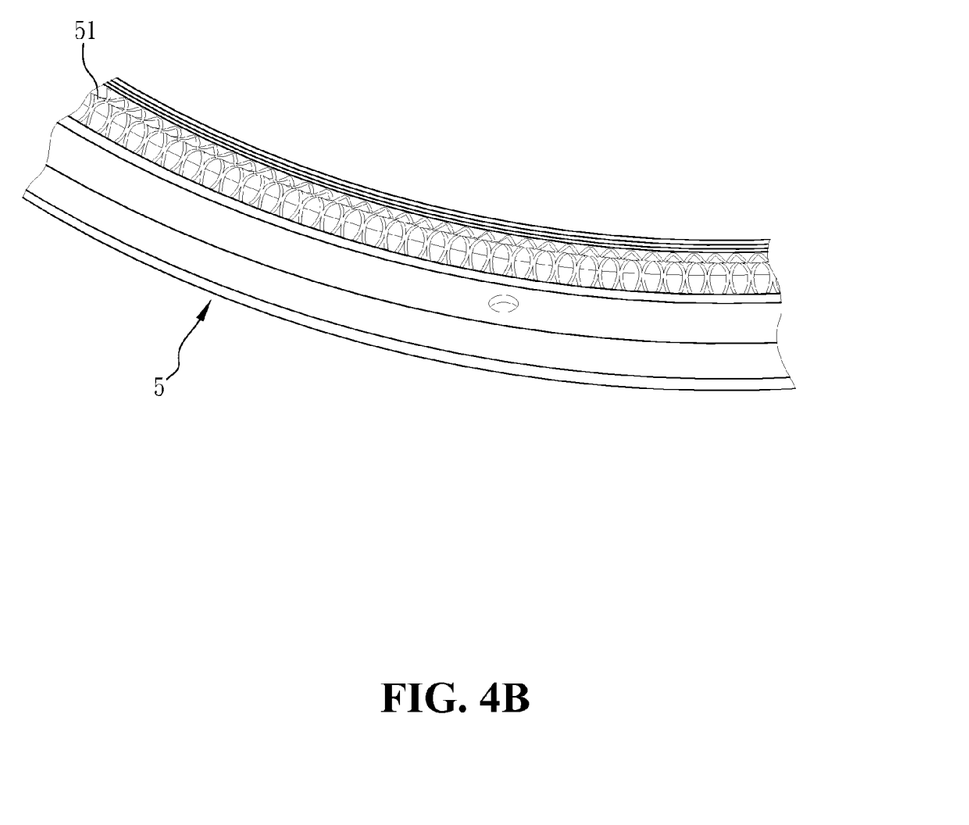
FIG. 4B shows a partially enlarged view of the carrier ring of the present invention.

As shown in FIG. 4A, the carrier ring 5 is for carrying a wafer. The inner edge of the carrier ring 5 is disposed with a plurality of carrying blocks 52 distributed in an equi-angle manner. The carrying blocks 52 are for placing the wafer. The upper part of the wall of the carrier ring 5 near the ring space has a protruding ring with an arc surface. The ring-shape protruding surface 51 is the surface of the protruding ring. In addition, the outermost of the carrier ring 5 is a ring surrounding wall 53. As shown in FIG. 4B, the pattern of the ring-shaped protruding surface 51 is a non-smooth surface formed by a plurality of crisscrossed trenches.

Figure 5:
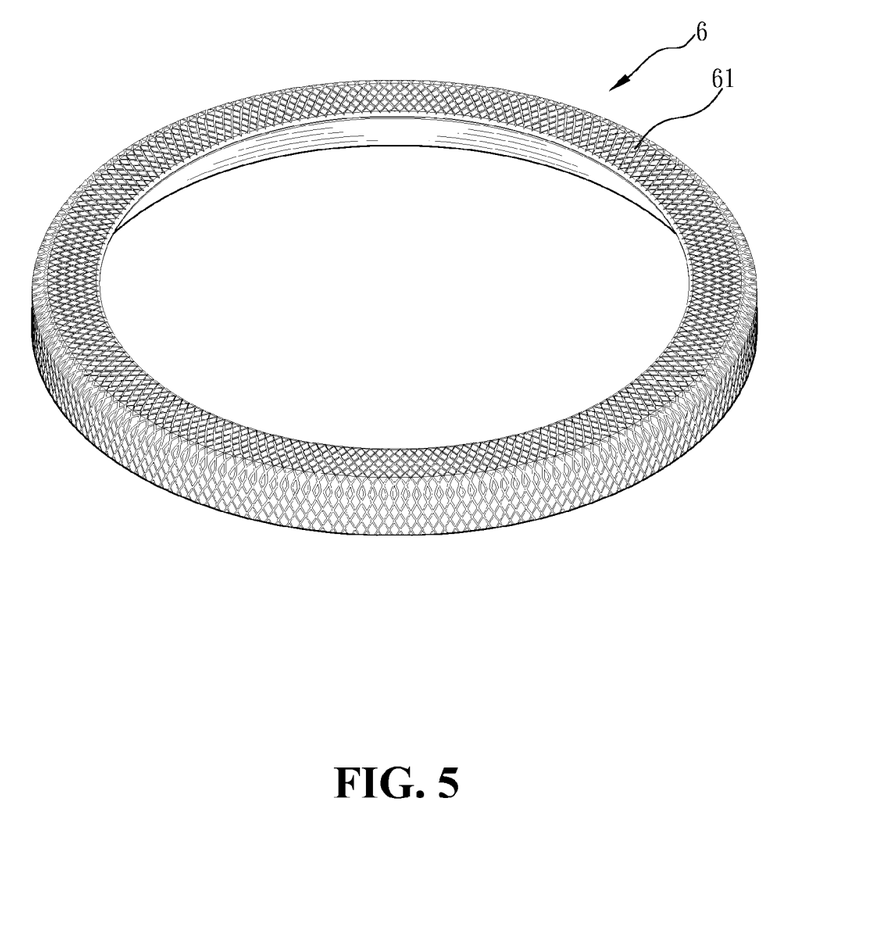
FIG. 5 shows a schematic view of the covering protective ring of the present invention.

FIG. 5 shows a schematic view of the covering protective ring 6. The covering protective ring 6 is disposed at the support base 21, as shown in FIG. 1. The covering protective ring 6 has a ring trench 62 at the bottom. When assembled, the ring trench 62 is engaged to the support base 21 so that the covering protective ring 6 is fixed inside the chamber case 2. The attachment surface 61 is the outer wall of the covering protective ring 6. In the present embodiment, the attachment surface 61 includes the vertical outer wall, top horizontal wall and the arc wall connecting the vertical and horizontal walls of the covering protective ring 6. The attachment surface 61 is a coarse surface with an uneven pattern. The pattern is a non-smooth surface formed by a plurality of crisscrossed trenches. Because the peeling of the deposition mainly occurs at the surface with non-zero outer curvature of the covering protective ring 6, the coarse surface on the attachment surface 61 can also be limited to a partial surface, in other words, the arc wall connecting the vertical and horizontal walls.

The pattern on the contact surface 41, ring-shape protruding surface 51 and attachment surface 61 is a non-smooth surface formed by a plurality of crisscrossed trenches. In the present embodiment, the depth of the trench ranges from 1.2 mm to 1.8 mm, preferably, 1.4-1.6 mm. The crisscross angle of the trenches ranges from 30° to 50°, preferably 40°-50°.

As such, when the deposition accumulates on the surfaces of, for example, contact surface 41, ring-shaped protruding surface 51 and attachment surface 61, during sputtering process, the coarse surface formed by a plurality of crisscrossed trenches in the present invention can withstand more deposition accumulation and avoids peeling of the deposition even when the deposition thickens. Hence, the cycle required to clean or replace the target fixing element 4, carrier ring 5 and covering protective ring 6 is extended so as to increase the utilization rate and reduce the cost.

Figure 6:
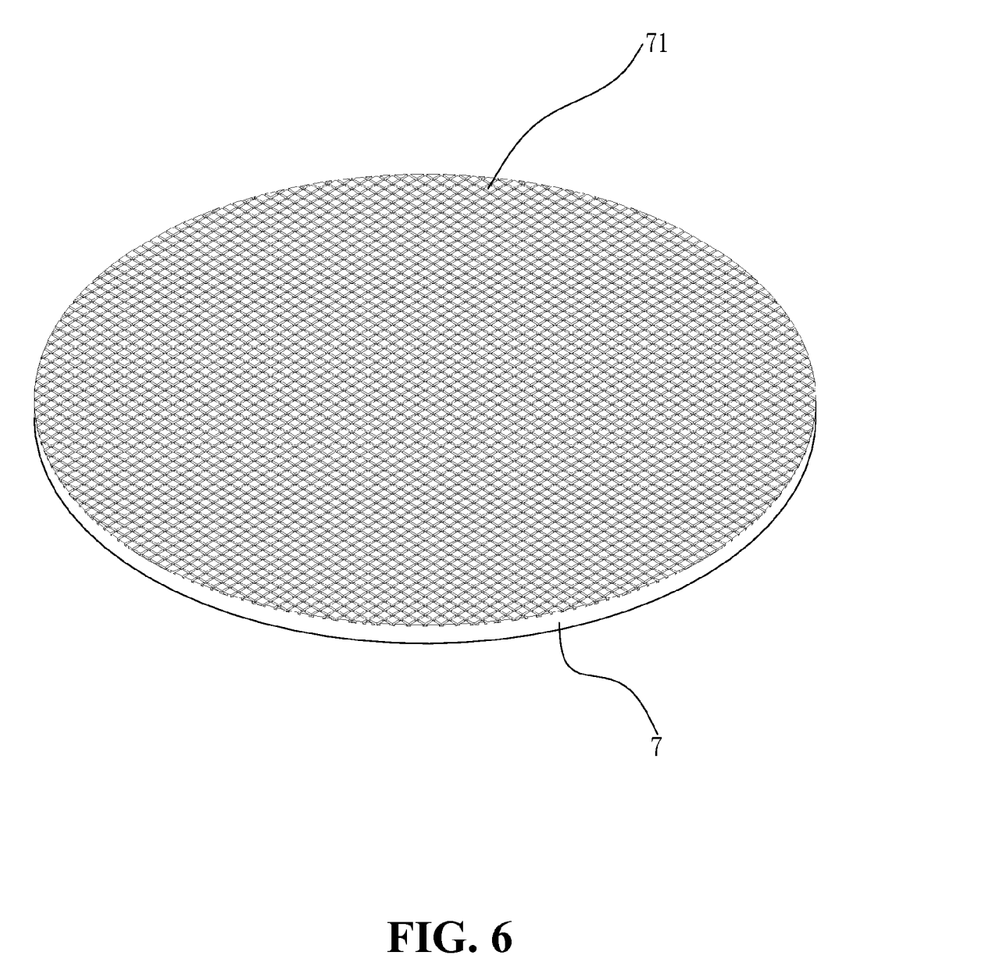
FIG. 6 show a schematic view of the test plate of the present invention.
Figure 7:
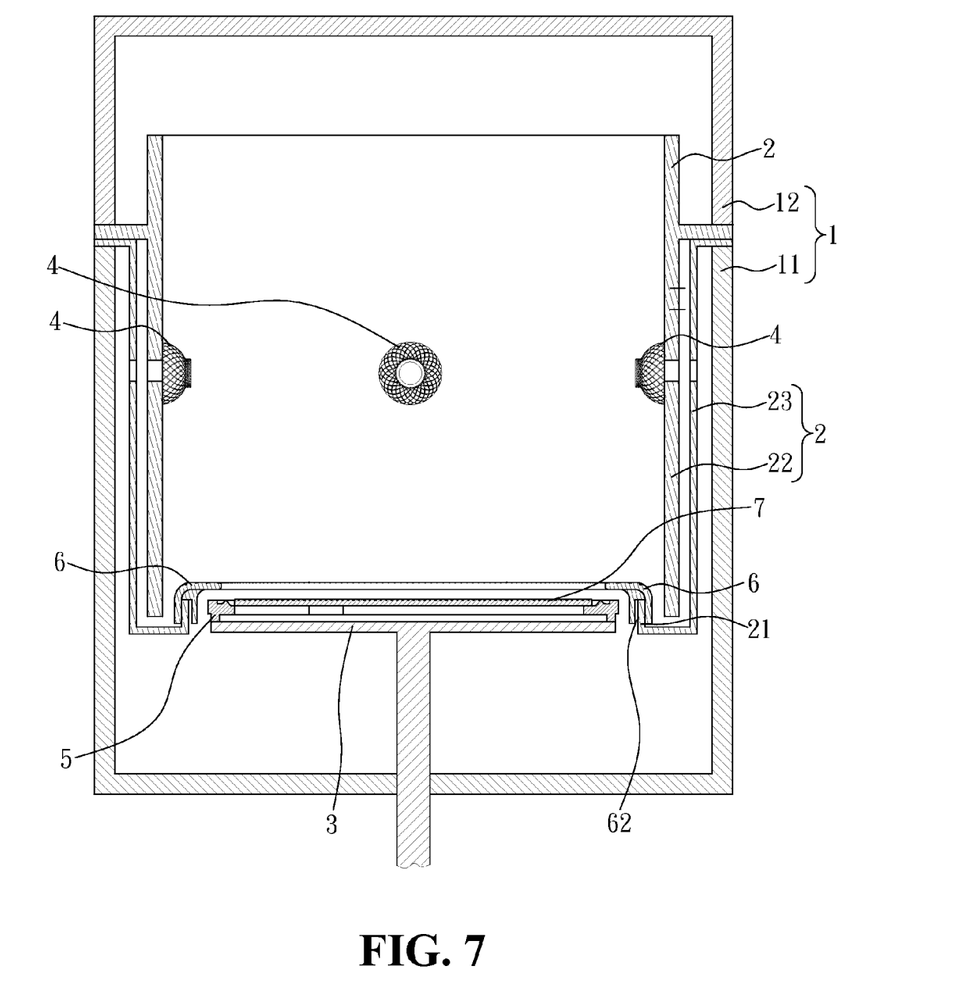
FIG. 7 shows a cross-sectional view of the structure of another embodiment according to the present invention.

FIG. 6 shows a schematic view of a test plate 7. In actual application, the test plate 7 is placed on the carrying blocks 52 of the carrier ring 5, as shown in FIG. 7. The test plate 7 is used in place of a wafer, after finishing sputtering a batch of wafers, for a test sputtering to inspect whether the sputtering parameters and location of components are correct or calibration is required. In the present embodiment, the upper surface 71 of the test plate 7 can also be designed as a coarse surface with uneven patterns. One of the patterns is a non-smooth surface formed by a plurality of crisscrossed trenches.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A structure of reaction chamber of semiconductor sputtering equipment, said reaction chamber comprising:
    a chamber case, having a hollow chamber, said chamber case having a support base of ring shape at the bottom;
    an elevation platform, able to access a space formed by the center of said support base;
    a plurality of target fixing elements, fixed inside an inner wall of said chamber case, said target fixing element having an exposed contact surface;
    a carrier ring, disposed at said elevation platform, said carrier ring having a ring-shaped protruding surface; and
    a covering protective ring, disposed at said support base, said covering protective ring having an attachment surface;
    wherein said contact surface of said target fixing element, said ring-shaped protruding surface of said carrier ring and said attachment surface of said covering protective ring are coarse surfaces having uneven patterns.

2. The structure of reaction chamber of semiconductor sputtering equipment as claimed in claim 1, wherein said uneven patterns are a non-smooth surface formed by a plurality of crisscrossed trenches.

3. The structure of reaction chamber of semiconductor sputtering equipment as claimed in claim 2, wherein said trenches have a depth ranging from 1.2 mm to 1.8 mm.

4. The structure of reaction chamber of semiconductor sputtering equipment as claimed in claim 1, wherein said carrier ring can carry a test plate, said test plate has a coarse upper surface, said coarse upper surface has uneven patterns, and one of said uneven patterns is a non-smooth surface formed by a plurality of crisscrossed trenches.

5. The structure of reaction chamber of semiconductor sputtering equipment as claimed in claim 1, wherein said target fixing element has a hollow shape formed by an arc cone and a cylinder, said cylinder is located at the smaller end of said arc cone, said contact surface is an outer wall of said arc cone and said cylinder, and said contact surface is entirely a coarse surface.

6. The structure of reaction chamber of semiconductor sputtering equipment as claimed in claim 1, wherein said target fixing element has a hollow shape formed by an arc cone and a cylinder, said cylinder is located at the smaller end of said arc cone, said contact surface is an outer wall of said arc cone and said cylinder, and a part of said contact surface is a coarse surface, located at at least one of the following two places: the outer wall of said arc cone, or a part connecting said arc cone and said cylinder.

7. The structure of reaction chamber of semiconductor sputtering equipment as claimed in claim 1, wherein said carrier ring has a protruding ring with an arc surface, and said ring-shaped protruding surface is an upper surface of said protruding ring.

8. The structure of reaction chamber of semiconductor sputtering equipment as claimed in claim 1, wherein said attachment surface comprises a vertical outer wall, a top horizontal outer wall and an arc wall connecting said vertical outer wall and horizontal outer wall of said covering protective ring, and said attachment surface is entirely a coarse surface.

9. The structure of reaction chamber of semiconductor sputtering equipment as claimed in claim 1, wherein said attachment surface comprises a vertical outer wall, a top horizontal outer wall and an arc wall connecting said vertical outer wall and horizontal outer wall of said covering protective ring, and a part of said attachment surface is a coarse surface, located at said arc wall.

10. The structure of reaction chamber of semiconductor sputtering equipment as claimed in claim 1, wherein said chamber case is a double-layer hollow chamber space formed by a protective wall and an outer wall, said support base is located at said outer wall and extends to an inner layer below a space formed by said protective wall.

* * * * *